(12) United States Patent
Hirata et al.

(10) Patent No.: US 7,632,895 B2
(45) Date of Patent: *Dec. 15, 2009

(54) CURABLE RESIN COMPOSITION

(75) Inventors: Kei Hirata, Ibaraki (JP); Koji Kitayama, Ibaraki (JP); Mizuho Maeda, Ibaraki (JP)

(73) Assignee: Kuraray Co., Ltd., Kurashiki-shi (JP)

( * ) Notice: Subject to any disclaimer, the term of this patent is extended or adjusted under 35 U.S.C. 154(b) by 398 days.

This patent is subject to a terminal disclaimer.

(21) Appl. No.: 10/546,892

(22) PCT Filed: Feb. 17, 2004

(86) PCT No.: PCT/JP2004/001678

§ 371 (c)(1),
(2), (4) Date: Aug. 24, 2005

(87) PCT Pub. No.: WO2004/076522

PCT Pub. Date: Sep. 10, 2004

(65) Prior Publication Data

US 2006/0074199 A1    Apr. 6, 2006

(30) Foreign Application Priority Data

Feb. 28, 2003   (JP) ............................. 2003-054355
Apr. 11, 2003   (JP) ............................. 2003-107917

(51) Int. Cl.
*C08C 19/06*    (2006.01)
(52) U.S. Cl. ........................ 525/383; 525/524
(58) Field of Classification Search ................ 525/383, 525/343
See application file for complete search history.

(56) References Cited

U.S. PATENT DOCUMENTS

| | | | |
|---|---|---|---|
| 3,073,792 A | 1/1963 | Greenspan et al. | |
| 5,837,749 A | 11/1998 | Erickson et al. | |
| 6,031,014 A | 2/2000 | Crivello | |
| 6,306,555 B1 * | 10/2001 | Schulz et al. | 430/270.1 |
| 6,380,287 B2 * | 4/2002 | Katayama et al. | 524/127 |
| 6,455,112 B1 * | 9/2002 | Ohkuma et al. | 427/504 |
| 2006/0142507 A1 | 6/2006 | Hirata et al. | |

FOREIGN PATENT DOCUMENTS

| | | |
|---|---|---|
| EP | 1 607 441 A1 | 12/2005 |
| JP | 60-217231 | 10/1985 |
| JP | 61-42504 | 3/1986 |
| JP | 64-14208 | 1/1989 |
| JP | 3-252488 | 11/1991 |
| JP | 7-022751 | 1/1995 |
| JP | 8-134135 | 5/1996 |
| JP | 2000-26830 | 1/2000 |
| JP | 2002-249516 | 9/2002 |
| JP | 2003313287 A * | 11/2003 |
| WO | WO 95/28431 | 10/1995 |
| WO | WO 97/00300 | 1/1997 |
| WO | WO 99/41296 | 8/1999 |
| WO | WO 01/29134 A1 | 4/2001 |

OTHER PUBLICATIONS

Carlo A. Ghilardi et al., Five-co-ordinate methylmercury and trimethyltin palladium and platinum complexes. X-ray crystal structure fo [N(CH$_2$CH$_2$PPh$_2$)$_3$Pt(HgMe)]BPh$_4$, J. Chem. Soc., Chem. Commun., pp. 1686-1688 1989.

Xigao Jian et al., "Epoxidation of unsaturated polymers with hydrogen peroxide", Journal of Polymer Science: Part C: Polymer Letters, vol. 28, pp. 285-288 1990.

C. Decker, et al., Macromol. Symp., vol. 102, pp. 63-71 (1996).

* cited by examiner

*Primary Examiner*—Mark Eashoo
*Assistant Examiner*—Megan McCulley
(74) *Attorney, Agent, or Firm*—Oblon, Spivak, McClelland, Maier & Neustadt, L.L.P.

(57) ABSTRACT

A curable resin composition includes (A) a cationically polymerizable-compound, (B) a cationic photopolymerization initiator, and (C) an epoxidized polyisoprene containing an epoxy group at 0.15 to 2.5 meq/g in the molecule and having a number-average molecular weight of 15000 to 200000. The curable resin composition shows excellent elongation properties and high break elongation even in a cured state and can give a cured product having superior compatibility, transparency, flexibility and waterproofness. Accordingly, the composition is suitable for use as adhesives, coating agents, encapsulating materials, inks, sealing materials and the like.

9 Claims, No Drawings

CURABLE RESIN COMPOSITION

FIELD OF THE INVENTION

The present invention relates to a curable resin composition. The curable resin composition of the invention has excellent compatibility, transparency, flexibility and waterproofness, and is useful for use as adhesives, coating agents, encapsulating materials, inks and sealing materials.

BACKGROUND OF THE INVENTION

The curing technology involving-activation energy rays such as electron beams and ultraviolet rays has developed as an important technology in the fields of adhesives, coating agents, encapsulating materials, inks and sealing materials from the viewpoints of recent organic solvent emission control and reduction of consumption of production energy. Mainstream in these fields is a photocuring technology in which a monomer or an oligomer, such as a polyfunctional acrylate or an unsaturated polyester, is UV radically polymerized. Therefore, most studies focus on the UV radical polymerization. Resin compositions curable by the UV radical polymerization have characteristics of a high curing rate and a wide variety of applicable monomers and oligomers to permit preparation of cured products with various properties. However, the polymerization is easily inhibited by air oxygen, and the monomers and oligomers used are highly toxic and possess strong odor and skin irritation.

Accordingly, studies have been made on a UV cationic polymerization technology that is free of a problem of inhibited polymerization by air and can use less toxic and odorous monomers and oligomers. However, the UV cationic polymerization has a limited number of employable compounds and does not permit control of properties of cured products as the UV radical polymerization does. In particular, cured products by the UV cationic polymerization have the drawback of being inflexible.

To solve the above problems, means proposed for obtaining flexible cured products by the UV cationic polymerization include (1) an ultraviolet curing precision adhesive that contains specified amounts of an epoxy resin, an inorganic powder filler, a cationic photopolymerization initiator, and an intramolecularly epoxy-modified polybutadiene (JP-A-H03-252488); (2) a multiwire board adhesive that contains specified amounts of a specific epoxy resin, a polyfunctional epoxy resin with at least three epoxy groups, an intramolecularly epoxy-modified polybutadiene with at least three epoxy groups, a cationic photopolymerization initiator, and a tin compound (JP-A-H07-22751); and (3) a photocurable resin composition for sealing that essentially contains a resin whose main chain skeleton is composed of a butadiene homopolymer or a butadiene copolymer and which has an average of at least 1.5 epoxy groups in a molecular terminal and/or a side chain per molecule, an epoxy resin, and a photosensitive aromatic onium salt (JP-A-S60-217231).

The compositions of (1) to (3) have a common technical idea that a cured product is imparted with flexibility by internal plasticizing that is provided by the components compounded. The intramolecularly epoxy-modified polybutadiene, which is disclosed to be substantially useful in JP-A-H03-252488, is an epoxidized polybutadiene having an epoxy equivalent of 200 (corresponding to an epoxy number of 5 meq/g). The intramolecularly epoxy-modified polybutadiene with at least three epoxy groups, which is disclosed to be substantially useful in JP-A-H07-22751, is a polybutadiene having a molecular weight of 3000 and an epoxy equivalent of 200 (corresponding to an epoxy number of 5 meq/g). When the compositions containing such highly epoxidized polybutadienes are cured, the crosslink density of the epoxidized polybutadiene is increased to lower the elongation, and the cured products cannot display adequate flexibility. Moreover, the resin whose main chain skeleton is composed of a butadiene homopolymer or a butadiene copolymer and which has an average of at least 1.5 epoxy groups in a molecular terminal and/or a side chain per molecule, which is disclosed to be substantially useful in JP-A-S60-217231, is highly modified and hence the crosslink density is increased, so that a cured product cannot show adequate flexibility (Examples disclose an intramolecularly epoxidized polybutadiene having a molecular weight of 1500 and an epoxy oxirane oxygen content of 7.7% (corresponding to an epoxy number of 4.8 meq/g)). Further, the epoxy-terminated epoxidized polybutadiene, which is generally produced by reaction with epichlorohydrin, contains large amounts of impurities such as by-product chloride ions, so that the photocurable resin composition shows lowered humidity resistance and exhibits a corrosive action when used in contact with metal parts.

It is therefore an object of the present invention to provide a curable resin composition that shows high elongation and excellent rubber elasticity even in a cured state and has superior compatibility, transparency, flexibility and waterproofness.

DISCLOSURE OF THE INVENTION

To achieve the above object, the invention provides a curable resin composition comprising (A) a cationically polymerizable compound, (B) a cationic photopolymerization initiator, and (C) an epoxidized polyisoprene containing an epoxy group at 0.15 to 2.5 meq/g in the molecule and having a number-average molecular weight of 15000 to 200000 (hereinafter the epoxidized polyisoprene (C)).

PREFERRED EMBODIMENTS OF THE INVENTION

The cationically polymerizable compound (A) for the curable resin composition is not particularly limited as long as it is curable by the cationic photopolymerization initiator (B). Preferred examples thereof include compounds having at least one epoxy or oxetane group in the molecule, and vinylether compounds. Specific examples include epoxy compounds such as 3,4-epoxycyclohexenylmethyl-3',4'-epoxycyclohexenecarboxylate, 1,2-epoxy-4-vinylcyclohexane, 1,2:8,9-diepoxylimonene and D-2,2,6-trimethyl-2,3-epoxy-bicyclo[3.1.1]heptane; oxetane compounds such as 3-ethyl-3-hydroxymethyloxetane, 1,4-bis[(3-ethyl-3-oxetanyl-methoxy)methyl]benzene, 3-ethyl-3-(phenoxymethyl)oxetane, bis[1-ethyl(3-oxetanyl)]methylether and 3-ethyl-3-(2-ethylhexyloxymethyl) oxetane; and vinylether compounds such as 2-hydroxyethylvinylether, 4-hydroxybutylvinylether and diethyleneglycol monovinylether. These cationically polymerizable compounds may be used singly or in combination of two or more kinds.

As used herein, the cationic photopolymerization initiator (B) for the curable resin composition is a compound that generates a strong acid by being decomposed by activation energy rays such as UV rays. Examples thereof include aromatic diazonium salts such as P-33 (trade name, manufactured by ASAHI DENKA CO., LTD.); aromatic iodonium salts such as Rhodorsil-2074 (trade name, manufactured by Rhodia Japan, Ltd.) and CD-1012 (trade name, manufactured by Sartomer Company, Inc.); aromatic sulfonium salts such as FC-512 and FC-509 (trade names, manufactured by 3M Company), CD-1011 (trade name, manufactured by Sartomer Company, Inc.), DAICAT 11 (trade name, manufactured by DAICEL CHEMICAL INDUSTRIES, LTD.) and SP-150 and SP-170 (trade names, manufactured by ASAHI DENKA CO., LTD.); and metallocene compounds such as IRGACURE 261 (trade name, manufactured by CIBA SPECIALTY CHEMICALS) These cationic photopolymerization initiators may be used singly or in combination of two or more kinds.

The amount of the cationic photopolymerization initiator (B) is not particularly restricted, and is preferably in the range of 0.01 to 20 parts by mass, and more preferably in the range of 0.5 to 10 parts by mass per 100 parts by mass of the cationically polymerizable compound (A) and the epoxidized polyisoprene (C) combined. Insufficient curing properties tend to result when the amount of the cationic photopolymerization initiator (B) is less than 0.01 part by mass per 100 parts by mass of the cationically polymerizable compound (A) and the epoxidized polyisoprene (C) combined. The use of the cationic photopolymerization initiator in an amount larger than 20 parts by mass does not much improve the curing properties of the curable resin composition and tends to result in bad economic efficiency.

The epoxidized polyisoprene (C) for the curable resin composition is required to contain an epoxy group at 0.15 to 2.5 meq/g in the molecule and have a number-average molecular weight of 15000 to 200000.

The epoxy group content of the epoxidized polyisoprene (C) is more preferably in the range of 0.15 to 2 meq/g. When the epoxidized polyisoprene (C) has an epoxy group content of less than 0.15 meq/g, it shows low compatibility with the cationically polymerizable compound (A), and the composition becomes heterogeneous with phase separation. On the other hand, the content exceeding 2.5 meq/g leads to a cured product in which the epoxidized polyisoprene (C) has dense crosslinking points, so that the cured product loses the rubber elasticity and becomes less flexible.

The number-average molecular weight of the epoxidized polyisoprene (C) is more preferably in the range of 15000 to 50000. When the number-average molecular weight is lower than 15000, the cured product has insufficient flexibility. On the other hand, when the number-average molecular weight exceeds 200000, the viscosity of the epoxidized polyisoprene (C) is so increased that the workability in preparation of the curable resin composition is deteriorated.

As used herein, the number-average molecular weight is in terms of polystyrene according to gel permeation chromatography (GPC).

The mixing ratio by mass of the cationically polymerizable compound (A) and the epoxidizedpolyisoprene (C) is preferably in the range of 10/90 to 90/10, and more preferably in the range of 10/90 to 50/50. When the cationically polymerizable compound (A)/epoxidized polyisoprene (C) mixing ratio by mass is not within 10/90, namely, when the epoxidized polyisoprene (C) is used at above 90% by mass, the rubber elasticity tends to be poor. When the cationically polymerizable compound (A)/epoxidized polyisoprene (C) mixing ratio by mass is not within 90/10, namely, when the epoxidized polyisoprene (C) is used at below 10% by mass, the curable resin composition tends to give a cured product having insufficient elongation properties.

There is particularly no limitation on the process for producing polyisoprene that is a material of the epoxidized polyisoprene (C). For example, anionic polymerization and Ziegler processes can be used. The anionic polymerization of isoprene may be performed in an inert gas atmosphere such as argon or nitrogen, in a solvent inactive in the polymerization such as hexane, cyclohexane, benzene or toluene, with use of an initiator such as an alkali metal (e.g., metallic sodium or metallic lithium) or an alkyllithium compound (e.g., methyllithium, ethyllithium, n-butyllithium or s-butyllithium), at a polymerization temperature of −100 to 100° C., and over a period of 0.01 to 200 hours.

Subsequently, the polyisoprene obtained is epoxidized at a carbon-carbon double bond to give an epoxidized polyisoprene (C). The process of epoxidation is not particularly limited, and exemplary processes include (i) treatment with a peracid such as peracetic acid (JP-A-H08-134135), (ii) treatment with a molybdenum complex and t-butylhydroperoxide (J. Chem. Soc., Chem. Commun., P.1686 (1989)), (iii) treatment with a tungstic acid catalyst and hydrogen peroxide (J. Polym. Sci., C, Vol. 28, P.285 (1990)), and (iv) treatment with a tungsten compound selected from ammonium tungstate and phosphotungstic acid, a quaternary ammonium salt, phosphoric acid, and an aqueous hydrogen peroxide solution (JP-A-2002-249516).

The curable resin composition according to the invention may contain curing accelerators, tackifiers, plasticizers, antioxidants, ultraviolet light absorbers, softening agents, antifoaming agents, pigments, dyes, organic fillers and perfumes, while still satisfying its properties.

To prepare the curable resin composition, the cationically polymerizable compound (A), the cationic photopolymerization initiator (B), the epoxidized polyisoprene (C) and the additives required may be mixed at room temperature using conventional mixing means such as a stirring machine or a kneader.

The curable resin composition maybe cured by irradiation with activation energy rays, with application of heat during or after the curing as required. The activation energy rays include corpuscular beams, electromagnetic waves and combinations thereof. The corpuscular beams include electron beams (EB) and α rays. The electromagnetic waves include ultraviolet (UV) rays, visible rays, infrared rays, γ rays and X rays. Of these, electron beams (EB) and ultraviolet (UV) rays are preferable.

The activation energy rays may be radiated using a known apparatus. For the electron beams (EB), the accelerating voltage and the irradiation dose are suitably in the range of 0.1 to 10 MeV and 1 to 500 kGy, respectively. A 200-450 nm wavelength lamp can be suitably used as an ultraviolet (UV) radiation source. The electron beam (EB) sources include tungsten filaments, and the ultraviolet (UV) sources include low-pressure mercury lamps, high-pressure mercury lamps, ultrahigh-pressure mercury lamps, halogen lamps, excimer lamps, carbon arc lamps, xenon lamps, zirconium lamps, fluorescent lamps and sun's ultraviolet rays. The curable resin composition is generally irradiated with the activation energy rays for 0.5 to 300 seconds, although variable depending on the magnitude of the energy.

The curable resin composition of the present invention shows high elongation and excellent rubber elasticity even in a cured state and has superior compatibility, transparency, waterproofness and flexibility, so that cracks and separation of cured products are reduced. Accordingly, the composition is suitable for use as adhesives, coating agents, encapsulating materials, inks, sealing materials and the like. The applications as adhesives include lamination of optical disks such as digital versatile disks (DVDs); bonding of optical lenses used in cameras and optical heads for playing DVDs and compact disks (CDs); bonding of optical members such as optical fibers; bonding of precision parts such as semiconductors with printed wiring boards; and use as dicing tapes for fixing wafers in the dicing step of semiconductor production. The applications as coating agents include coating of automobile head lamps; and coating of optical fibers. The applications as encapsulating materials include encapsulation of precision parts such as liquid crystal display elements and semiconductors. The applications as inks include resist inks used in the fabrication of semiconductors and printed wiring boards, and printing inks for printing on aluminum foil paper, polyethylene-coated paper, vinyl chloride sheets, polyester sheets, polypropylene sheets, food cans and beverage cans. The applications as sealing materials include sealing in automobile bodies and buildings.

The curable resin composition provided by the invention can give a cured product that shows excellent elongation properties and high break elongation and has superior compatibility, transparency, flexibility and waterproofness.

EXAMPLES

The present invention will be hereinafter described in greater detail by Examples, but it should be construed that the invention is in no way limited to those Examples. The curable resin compositions in Examples and Comparative Examples were evaluated for properties as described below. In Tables 1 through 4 that follow, amounts are in parts by mass.

[1] Compatibility

The curable resin compositions obtained in Examples and Comparative Examples were visually evaluated for homogeneity.
AA: Good compatibility (the composition was homogeneous)
BB: Turbidity
CC: Phase separation

[2] Transparency of Cured Product

The curable resin compositions obtained in, Examples and Comparative Examples were each poured into a 0.8 mm thick mold, and the surface of the composition was covered with a 0.2 mm thick polypropylene sheet. Subsequently, the composition was irradiated with ultraviolet rays for 30 seconds with use of a high-pressure mercury lamp (30 W/cm) arranged 20 cm apart from the polypropylene sheet. The composition was then allowed to stand for 30 minutes in a thermostatic chamber temperature controlled at 60° C. to give a cured product. The polypropylene sheet was removed from the cured product, and the transparency was visually evaluated.
AA: Good transparency
BB: Turbidity
CC: No transparency

[3] Break Strength and Break Elongation

The cured products obtained by removing the polypropylene sheet in [2] were each allowed to stand in a 25° C. atmosphere for 24 hours. Subsequently, rectangular test specimens 60 mm long by 6 mm wide by 0.8 mm thick were prepared from the cured products. They were tensile tested at a stress rate of 10 mm/min to determine the break strength and the break elongation.

[4] Hardness 10 pieces of the cured products obtained by removing the polypropylene sheet in [2] were laminated together to a thickness of 8 mm, and the hardness was determined with a Type A durometer in accordance with JIS K 6253.

[5] Water Absorption

Test specimens 3 cm long by 3 cm wide by 0.8 mm thick were prepared from the cured products obtained by removing the polypropylene sheet in [2]. They were vacuum dried at 80° C. for 12 hours and were measured for mass. The specimens were then immersed in 25° C. water for 24 hours and were taken out, and the water droplets on the surface were all wiped with a towel. The mass was measured again to determine the water absorption based on the mass increase relative to the original.

[6] Curing Properties

The specimens obtained by removing the polypropylene sheet in [2] were visually evaluated for curing properties.
AA: Cured
BB: Insufficiently cured
CC: Uncured

[7] Gel Fraction

Test specimens 30 mm long by 6 mm wide by 0.8 mm thick were prepared from the cured products obtained by removing the polypropylene sheet in [2], and the mass was measured ($m_0$) The specimens were then immersed in 50 ml of toluene for 12 hours and were vacuum dried at 110° C. for 3 hours. The mass was measured again ($m_1$), and the gel fraction was determined from the following formula:

Gel fraction (%)=100×$m_1$/$m_0$

The components employed in Examples and Comparative Examples are the following.

Cationically Polymerizable Compound (A)
A-1: CELLOXIDE 2021 (trade name, manufactured by DAICEL CHEMICAL INDUSTRIES, LTD.) (3,4-epoxycyclohexenylmethyl-3',4'-epoxycyclohexenecarboxylate)
A-2: OXT-121 (trade name, manufactured by TOAGOSEI CO., LTD.) (1,4-bis[(3-ethyl-3-oxetanylmethoxy)methyl]benzene)
A-3: α-pinene oxide (trade name, manufactured by DAICEL CHEMICAL INDUSTRIES, LTD.)
(D-2,2,6-trimethyl-2,3-epoxybicyclo[3.1.1]heptane)
A-4: OXT-211 (trade name, manufactured by TOAGOSEI CO., LTD.) (3-ethyl-3-(phenoxymethyl)oxetane)
A-5: OXT-212 (trade name, manufactured by TOAGOSEI CO., LTD.) (3-ethyl-3-(2-ethylhexyloxymethyl)oxetane)

Cationic Photopolymerization Initiator (B)
Rhodorsil-2074 (trade name, manufactured by Rhodia Japan, Ltd.)

Epoxidized Polyisoprene (C)

Reference Example 1

(1) A 5-liter autoclave purged with nitrogen was charged with 2000 g of hexane and 2.5 g of n-butyllithium, followed by heating to 50° C. Subsequently, 650 g of isoprene was added and polymerization was carried out for 3 hours. Part of the reaction liquid was sampled to analyze the product by GPC, which showed that a polyisoprene had occurred which had a number-average molecular weight (Mn) of 27000 in terms of polystyrene, and a molecular weight distribution (Mw/Mn) of 1.16.

(2) 300 g of the polymerization solution obtained in (1) above was washed with water and was introduced into a 1-liter autoclave. Further, 0.02 g of phosphotungstic acid, 0.02 g of phosphoric acid, 1.4 g of a 35% by mass aqueous solution of hydrogen peroxide, 90 g of water and 0.03 g of trioctylmethylammonium chloride were added, and reaction was performed at 80° C. for 3 hours. The resulting reaction liquid was poured into methanol to reprecipitate the polymer, and the polymer was filtered out and was vacuum dried at 80°

C. for 7 hours to give 70 g of an epoxidized polyisoprene (hereinafter abbreviated to e-IR-1). GPC analysis of e-IR-1 resulted in Mn=27000 and Mw/Mn=1.16. Approximately 0.5 g of e-IR-1 was weighed out and was dissolved in 10 ml of tetrahydrofuran (THF) at 25° C. The solution was combined with 10 ml of a solution of 0.2N hydrochloric acid in THF, and the mixture was stirred for 30 minutes to perform reaction of the epoxy group in e-IR-1 with the hydrochloric acid. The excess of hydrochloric acid was titrated using a solution of 0.1N potassium hydroxide in ethanol to determine the epoxy number to be 0.12 meq/g. (This process will be hereinafter referred to as the back titration of hydrochloric acid.)

Reference Example 2

300 g of a polyisoprene solution obtained in the same manner as in Reference Example 1 (1) was washed with water and was introduced into a 1-liter autoclave. Further, 0.16 g of phosphotungstic acid, 0.15 g of phosphoric acid, 13 g of a 35% by mass aqueous solution of hydrogen peroxide, 90 g of water and 0.26 g of trioctylmethylammonium chloride were added, and reaction was performed at 80° C. for 3 hours. The resulting reaction liquid was poured into methanol to reprecipitate the polymer, and the polymer was filtered out and was vacuum dried at 80° C. for 7 hours to give 70 g of an epoxidized polyisoprene (hereinafter abbreviated to e-IR-2). GPC analysis of e-IR-2 resulted in Mn=27600 and Mw/Mn=1.16. The back titration of hydrochloric acid was carried out in the same manner as in Reference Example 1 (2), and the epoxy number was determined to be 1.5 meq/g.

Reference Example 3

300 g of a polyisoprene solution obtained in the same manner as in Reference Example 1 (1) was washed with water and was introduced into a 1-liter autoclave. Further, 0.27 g of phosphotungstic acid, 0.25 g of phosphoric acid, 22 g of a 35% by mass aqueous solution of hydrogen peroxide, 90 g of water and 0.43 g of trioctylmethylammonium chloride were added, and reaction was performed at 80° C. for 3 hours. The resulting reaction liquid was poured into methanol to reprecipitate the polymer, and the polymer was filtered out and was vacuum dried at 80° C. for 7 hours to give 70 g of an epoxidized polyisoprene (hereinafter abbreviated to e-IR-3). GPC analysis of e-IR-3 resulted in Mn=28000 and Mw/Mn=1.18. The back titration of hydrochloric acid was carried out in the same manner as in Reference Example 1 (2), and the epoxy number was determined to be 2.4 meq/g.

Reference Example 4

300 g of a polyisoprene solution obtained in the same manner as in Reference Example 1 (1) was washed with water and was introduced into a 1-liter autoclave. Further, 0.05 g of phosphotungstic acid, 0.05 g of phosphoric acid, 4.5 g of a 35% by mass aqueous solution of hydrogen peroxide, 90 g of water and 0.09 g of trioctylmethylammonium chloride were added, and reaction was performed at 80° C. for 3 hours. The resulting reaction liquid was poured into methanol to reprecipitate the polymer, and the polymer was filtered-out and was vacuum dried at 80° C. for 7 hours to give 70 g of an epoxidized polyisoprene (hereinafter abbreviated to e-IR-4). GPC analysis of e-IR-4 resulted in Mn=27300 and Mw/Mn=1.16. The back titration of hydrochloric acid was carried out in the same manner as in Reference Example 1 (2), and the epoxy number was determined to be 0.5 meq/g.

Reference Example 5

(1) A 5-liter autoclave purged with nitrogen was charged with 2000 g of hexane and 4.0 g of sec-butyllithium, followed by heating to 50° C. Subsequently, 650 g of isoprene was added and polymerization was carried out for 3 hours. Part of the reaction liquid was sampled to analyze the product by GPC, which showed that a polyisoprene had occurred which had Mn of 19200 and Mw/Mn of 1.02.

(2) 300 g of the polyisoprene solution obtained in (1) above was washed with water and was introduced into a 1-liter autoclave. Further, 0.05 g of phosphotungstic acid, 0.05 g of phosphoric acid, 4.5 g of a 35% by mass aqueous solution of hydrogen peroxide, 90 g of water and 0.09 g of trioctylmethylammonium chloride were added, and reaction was performed at 80° C. for 3 hours. The resulting reaction liquid was poured into methanol to reprecipitate the polymer, and the polymer was filtered out and was vacuum dried at 80° C. for 7 hours to give 70 g of an epoxidized polyisoprene (hereinafter abbreviated to e-IR-5). GPC analysis of e-IR-5 resulted in Mn=19300 and Mw/Mn=1.02. The back titration of hydrochloric acid was carried out in the same manner as in Reference Example 1 (2), and the epoxy number was determined to be 0.5 meq/g.

Reference Example 6

(1) A 5-liter autoclave purged with nitrogen was charged with 2000 g of hexane and 7.4 g of sec-butyllithium, followed by heating to 50° C. Subsequently, 650 g of isoprene was added and polymerization was carried out for 3 hours. Part of the reaction liquid was sampled to analyze the product by GPC, which showed that a polyisoprene had occurred which had Mn of 10400 and Mw/Mn of 1.02.

(2) 300 g of the polyisoprene solution obtained in (1) above was washed with water and was introduced into a 1-liter autoclave. Further, 0.05 g of phosphotungstic acid, 0.05 g of phosphoric acid, 4.5 g of a 35% by mass aqueous solution of hydrogen peroxide, 90 g of water and 0.09 g of trioctylmethylammonium chloride were added, and reaction was performed at 80° C. for 3 hours. The resulting reaction liquid was poured into methanol to reprecipitate the polymer, and the polymer was filtered out and was vacuum dried at 80° C. for 7 hours to give 70 g of an epoxidized polyisoprene (hereinafter abbreviated to e-IR-6). GPC analysis of e-IR-6 resulted in Mn=10500 and Mw/Mn=1.02. The back titration of hydrochloric acid was carried out in the same manner as in Reference Example 1 (2), and the epoxy number was determined to be 0.5 meq/g.

Reference Example 7

(1) A 5-liter autoclave purged with nitrogen was charged with 2000 g of hexane and 15.9 g of sec-butyllithium, followed by heating to 50° C. Subsequently, 650 g of isoprene was added and polymerization was carried out for 3 hours. Part of the reaction liquid was sampled to analyze the product by GPC, which showed that a polyisoprene had occurred which had Mn of 4900 and Mw/Mn of 1.03.

(2) 300 g of the polyisoprene solution obtained in (1) above was washed with water and was introduced into a 1-liter autoclave. Further, 0.05 g of phosphotungstic acid, 0.05 g of phosphoric acid, 4.5 g of a 35% by mass aqueous solution of hydrogen peroxide, 90 g of water and 0.09 g of trioctylmethylammonium chloride were added, and reaction was performed at 80° C. for 3 hours. The resulting reaction liquid was poured into methanol to reprecipitate the polymer, and the polymer was filtered out and was vacuum dried at 80° C. for 7 hours to give 70 g of an epoxidized polyisoprene (hereinafter abbreviated to e-IR-7). GPC analysis of e-IR-7 resulted in Mn=4900 and Mw/Mn=1.03. The back titration of hydrochloric acid was carried out in the same manner as in Reference Example 1 (2), and the epoxy number was determined to be 0.5 meq/g.

Examples 1 and 2

The cationically polymerizable compounds (A-1) and (A-3), the cationic photopolymerization initiator (B), and e-IR-2 obtained in Reference Example 2 were added to a vessel according to the formulation shown in Table 1. They were mixed with a mixing blade at room temperature for 20 minutes to give a curable resin composition. The curable resin compositions were evaluated for properties by the aforementioned methods. The results are shown in Table 1.

Examples 3 and 4

Curable resin compositions were obtained and were evaluated for properties by the procedure of Examples 1 and 2, except that e-IR-2 was replaced with e-IR-3 obtained in Reference Example 3. The results are shown in Table 1.

Examples 5 and 6

Curable resin compositions were obtained and were evaluated for properties by the procedure of Examples 1 and 2, except that the cationically polymerizable compound (A-1) was replaced with (A-2). The results are shown in Table 1.

Examples 7 and 8

Curable resin compositions were obtained and were evaluated for properties by the procedure of Examples 5 and 6, except that e-IR-2 was replaced with e-IR-3 obtained in Reference Example 3. The results are shown in Table 1.

Comparative Examples 1 and 2

Curable resin compositions were produced and were evaluated for properties by the procedure of Examples 1 and 2, except that e-IR-2 was replaced with e-IR-1 obtained in Reference Example 1. The results are shown in Table 2.

Comparative Examples 3 and 4

Curable resin compositions were produced and were evaluated for properties by the procedure of Examples 1 and 2, except that e-IR-2 was replaced with an epoxidized polybutadiene (E-1800-6.5 (trade name), manufactured by NIPPON PETROCHEMICALS COMPANY, LIMITED, Mn=120, Mw=9200 (Mn and Mw in terms of polystyrene), epoxy number: 4.1 meq/g). The results are shown in Table 2.

Comparative Examples 5 and 6

Curable resin compositions were produced and were evaluated for properties by the procedure of Examples 5 and 6, except that e-IR-2 was replaced with e-IR-1 obtained in Reference Example 1. The results are shown in Table 2.

Comparative Examples 7 and 8

Curable resin compositions were produced and were evaluated for properties by the procedure of Examples 5 and 6, except that e-IR-2 was replaced with an epoxidized polybutadiene (E-1800-6.5 (trade name), manufactured by NIPPON PETROCHEMICALS COMPANY, LIMITED, Mn=120, Mw=9200 (Mn and Mw in terms of polystyrene), epoxy number: 4.1 meq/g). The results are shown in Table 2.

TABLE 1

| | Example | | | | | | | |
|---|---|---|---|---|---|---|---|---|
| | 1 | 2 | 3 | 4 | 5 | 6 | 7 | 8 |
| Cationically polymerizable compound (A) | | | | | | | | |
| A-1 | 25 | 50 | 25 | 50 | — | — | — | — |
| A-2 | — | — | — | — | 25 | 50 | 25 | 50 |
| A-3 | 30 | 30 | 30 | 30 | 30 | 30 | 30 | 30 |
| Cationic photopolymerization initiator (B) | 3 | 3 | 3 | 3 | 3 | 3 | 3 | 3 |
| Epoxidized polyisoprene (C) | | | | | | | | |
| e-IR-2 | 75 | 50 | — | — | 75 | 50 | — | — |
| e-IR-3 | — | — | 75 | 50 | — | — | 75 | 50 |
| Compatibility | AA | AA | AA | AA | AA | AA | AA | AA |
| Curing properties | AA | AA | AA | AA | AA | AA | AA | AA |
| Transparency | AA | AA | AA | AA | AA | AA | AA | AA |
| Break strength (MPa) | 4 | 11 | 7 | 24 | 1 | 6 | 2 | 7 |
| Break elongation (%) | 98 | 39 | 101 | 20 | 74 | 61 | 43 | 42 |
| Hardness (JIS-A) | 75 | 92 | 76 | 93 | 58 | 73 | 73 | 85 |
| Water absorption (%) | 0.24 | 0.27 | 0.26 | 0.22 | 0.24 | 0.27 | 0.26 | 0.22 |

TABLE 2

|  | Comparative Example | | | | | | | |
|---|---|---|---|---|---|---|---|---|
|  | 1 | 2 | 3 | 4 | 5 | 6 | 7 | 8 |
| Cationically polymerizable compound (A) | | | | | | | | |
| A-1 | 25 | 50 | 25 | 50 | — | — | — | — |
| A-2 | — | — | — | — | 25 | 50 | 25 | 50 |
| A-3 | 30 | 30 | 30 | 30 | 30 | 30 | 30 | 30 |
| Cationic photopolymerization initiator (B) | 3 | 3 | 3 | 3 | 3 | 3 | 3 | 3 |
| Epoxidized polyisoprene (C) | | | | | | | | |
| e-IR-1 | 75 | 50 | — | — | 75 | 50 | — | — |
| Epoxidized polybutadiene | | | | | | | | |
| E-1800-6.5 (trade name) | — | — | 75 | 50 | — | — | 75 | 50 |
| Compatibility | CC | CC | AA | AA | CC | CC | AA | AA |
| Curing properties | —[1] | —[1] | AA | AA | —[1] | —[1] | AA | AA |
| Transparency | —[1] | —[1] | AA | AA | —[1] | —[1] | AA | AA |
| Break strength (MPa) | —[1] | —[1] | 36 | 48 | —[1] | —[1] | 21 | 26 |
| Break elongation (%) | —[1] | —[1] | 6 | 7 | —[1] | —[1] | 12 | 8 |
| Hardness (JIS-A) | —[1] | —[1] | 97 | 94 | —[1] | —[1] | 95 | 91 |
| Water absorption (%) | —[1] | —[1] | 0.41 | 0.44 | —[1] | —[1] | 0.41 | 0.44 |

[1] Not evaluated because of too low compatibility

The results shown in Table 1 establish that the curable resin compositions that contain the epoxidized polyisoprenes (e-IR-2 and e-IR-3) having the epoxy number specified in the invention are excellent in compatibility of the cationically polymerizable compound (A) and can give cured products with excellent elongation properties and superior transparency, flexibility and waterproofness.

On the other hand, the results given in Table 2 show that curable resin compositions that contain an epoxidized polyisoprene (e-IR-1) having an epoxy number less than specified in the invention are bad in compatibility of the cationically polymerizable compound (A) and suffer phase separation. Further, the use of a conventional epoxidized polybutadiene is shown to result in low elongation and poor flexibility.

Examples 9 and 10

The cationically polymerizable compounds (A-4) and (A-5), the cationic photopolymerization initiator (B), and e-IR-4 obtained in Reference Example 4 were added to a vessel according to the formulation shown in Table 3. They were mixed with a mixing blade at room temperature for 20 minutes to give a curable resin composition. The curable resin compositions were evaluated for properties by the aforementioned methods. The results are shown in Table 3.

Examples 11 and 12

Curable resin compositions were obtained and were evaluated for properties by the procedure of Examples 9 and 10, except that e-IR-4 was replaced with e-IR-5 obtained in Reference Example 5. The results are shown in Table 3.

TABLE 3

|  | Example | | | |
|---|---|---|---|---|
|  | 9 | 10 | 11 | 12 |
| Cationically polymerizable compound (A) | | | | |
| A-4 | 50 | — | 50 | — |
| A-5 | — | 50 | — | 50 |
| Cationic photopolymerization initiator (B) | 0.5 | 0.5 | 0.5 | 0.5 |
| Epoxidized polyisoprene (C) | | | | |
| e-IR-4 | 50 | 50 | — | — |
| e-IR-5 | — | — | 50 | 50 |
| Compatibility | AA | AA | AA | AA |
| Curing properties | AA | AA | AA | AA |
| Transparency | AA | AA | AA | AA |
| Break strength (MPa) | 0.6 | 0.5 | 0.4 | 0.5 |
| Break elongation (%) | 211 | 112 | 211 | 126 |
| Hardness (JIS-A) | 30 | 30 | 18 | 27 |
| Water absorption (%) | 0.11 | 0.03 | 0.08 | 0.04 |
| Gel fraction (%) | 95 | 98 | 93 | 97 |

Comparative Examples 9 and 10

Curable resin compositions were produced and were evaluated for properties by the procedure of Examples 9 and 10, except that e-IR-4 was replaced with e-IR-6 obtained in Reference Example 6. The results are shown in Table 4.

Comparative Examples 11 and 12

Curable resin compositions were produced and were evaluated for properties by the procedure of Examples 9 and 10, except that e-IR-4 was replaced with e-IR-7 obtained in Reference Example 7. -The results are shown in Table 4.

Comparative Examples 13 and 14

Curable resin compositions were produced and were evaluated for properties by the procedure of Examples 9 and 10, except that e-IR-4 was replaced with an epoxidized polybutadiene (EPOLEAD PB3600 (trade name), manufactured by DAICEL CHEMICAL INDUSTRIES, LTD., Mn=5600, Mw=19300 (Mn and Mw in terms of polystyrene), epoxy number: 4.8 meq/g). The results are shown in Table 4.

TABLE 4

|  | Comparative Example | | | | | |
|---|---|---|---|---|---|---|
|  | 9 | 10 | 11 | 12 | 13 | 14 |
| Cationically polymerizable compound (A) | | | | | | |
| A-4 | 50 | — | 50 | — | 50 | — |
| A-5 | — | 50 | — | 50 | — | 50 |
| Cationic photopolymerization initiator (B) | 0.5 | 0.5 | 0.5 | 0.5 | 0.5 | 0.5 |
| Epoxidized polyisoprene (C) | | | | | | |
| e-IR-6 | 50 | 50 | — | — | — | — |
| e-IR-7 | — | — | 50 | 50 | — | — |
| Epoxidized polybutadiene | | | | | | |
| EPOLEAD PB3600 (trade name) | — | — | — | — | 50 | 50 |
| Compatibility | AA | AA | AA | AA | AA | AA |
| Curing properties | BB | BB | CC | CC | AA | AA |
| Transparency | AA | AA | —[2] | —[2] | AA | AA |
| Break strength (MPa) | 0.3 | 0.3 | —[2] | —[2] | 26 | 6.8 |
| Break elongation (%) | 201 | 150 | —[2] | —[2] | 40 | 30 |
| Hardness (JIS-A) | 11 | 19 | —[2] | —[2] | 98 | 90 |
| Water absorption (%) | 0.03 | 0.04 | —[2] | —[2] | 0.32 | 0.24 |
| Gel fraction (%) | 79 | 83 | —[2] | —[2] | 99 | 99 |

[2] Not evaluated because of too low curing properties

The results shown in Table 3 establish that the curable resin compositions that contain the epoxidized polyisoprenes (e-IR-4 and e-IR-5) having the epoxy number specified in the invention are excellent in compatibility of the cationically polymerizable compound (A) and can give cured products with excellent elongation properties and superior transparency, flexibility and waterproofness.

On the other hand, the results given in Table 4 show that curable resin compositions that contain epoxidized polyisoprenes (e-IR-6 and e-IR-7) having a molecular weight less than specified in the invention have a low gel fraction after UV irradiated and are insufficiently cured. Further, the use of a conventional epoxidized polybutadiene is shown to result in low elongation and poor flexibility.

INDUSTRIAL APPLICABILITY

The curable resin composition of the present invention has superior compatibility, transparency, flexibility and waterproofness, and is suitable for use as adhesives, coating agents, encapsulating materials, inks, sealing materials and the like.

The invention claimed is:

1. A curable resin composition comprising (A) at least one cationically polymerizable compound, (B) at least one cationic photopolymerization initiator, and (C) an epoxidized polyisoprene containing an epoxy group at 0.15 to 2.5 meq/g in the molecule and having a number-average molecular weight of 15000 to 200000.

2. The curable resin composition according to claim 1, wherein component (A) comprises a compound having at least one epoxy or oxetane group in its molecule, or a vinyl ether compound.

3. The curable resin composition according to claim 1, wherein component (B) is present in an amount of 0.01 to 20 parts by mass per 100 parts by mass of components (A) and (C) combined.

4. The curable resin composition according to claim 1, wherein component (B) is present in an amount of 0.5 to 10 parts by mass per 100 parts by mass of components (A) and (C) combined.

5. The curable resin composition according to claim 1, wherein component (C) has an epoxy content of 0.15 to 2 meq/g.

6. The curable resin composition according to claim 1, wherein component (C) has a number-average molecular weight of 15000 to 50000.

7. The curable resin composition according to claim 1, wherein components (A) and (C) are present in a ratio by mass of 10/90 to 90/10.

8. The curable resin composition according to claim 1, wherein components (A) and (C) are present in a ratio by mass of 10/90 to 50/50.

9. A cured resin obtained by curing the curable resin composition of claim 1.

* * * * *